March 9, 1965 E. T. HANDELMAN 3,172,792
EPITAXIAL DEPOSITION IN A VACUUM ONTO SEMICONDUCTOR WAFERS THROUGH AN INTERACTION BETWEEN THE WAFER AND THE SUPPORT MATERIAL
Filed July 5, 1961
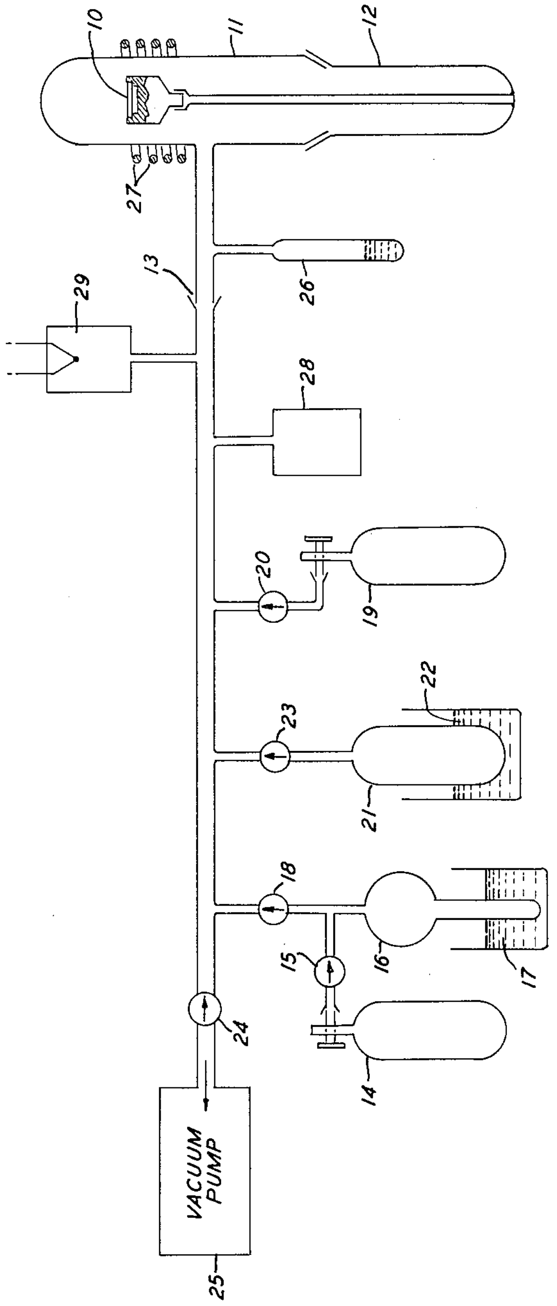
INVENTOR
E. T. HANDELMAN
BY
ATTORNEY United States Patent Office 3,172,792

Patented Mar. 9, 1965

3,172,792

EPITAXIAL DEPOSITION IN A VACUUM ONTO SEMICONDUCTOR WAFERS THROUGH AN INTERACTION BETWEEN THE WAFER AND THE SUPPORT MATERIAL

Eileen T. Handelman, Short Hills, N.J., assignor to Bell Telephone Laboratories, Incorporated, New York, N.Y., a corporation of New York Filed July 5, 1961, Ser. No. 121,999
12 Claims. (Cl. 148—175)

This invention relates to a novel procedure for the direct vapor phase transfer of semiconductor material and is particularly adapted for the formation of thin semiconductor films on semiconductor substrates including those of an epitaxial nature.

The novel procedure of this invention involves a direct mass transfer of semiconductor material from a solid phase source having essentially the composition desired in the film, to a semiconductor substrate. This transfer is achieved through an oxidation-reduction mechanism initiated and controlled by certain parameters including primarily, the pressure and composition of the atmosphere in a closed reaction chamber and the relative temperature of the solid source material and the semiconductor substrate. The procedure of this invention results in a high degree of control over the thickness, uniformity and composition of the film formed. Specifically, this procedure is adapted to the formation of high resistivity films which have been unobtainable using conventional prior art techniques.

This invention is particularly suited to the formation of epitaxial films and this description will accordingly be thus restricted. Epitaxial layers of semiconductors of various desired conductivities, on semiconductor or conducting surfaces, have recently become of interest in the manufacture of semiconductor devices, particularly various forms of transistors. The uses and requirements of epitaxial layers are now well established in the art and various particular devices utilizing such layers and their prescribed uses can be found, for instance, in copending application Serial No. 35,152, filed June 10, 1960.

Prior techniques for growing epitaxial semiconductor films have relied generally on chemically reducing a source vapor, generally a tetrahalide, with a reducing gas, typically hydrogen. The control of the various parameters involving the equilibrium of the reaction has proved difficult and high resistivity films have, for reasons not wholly apparent, been impossible to obtain. Utilizing the procedure of the present invention epitaxial films of extremely high quality have been grown with exceptional crystalline perfection and uniform film thicknesses. For instance, the best known prior art techniques are capable of producing ten micron films with typical and unavoidable thickness variations of the order of 1–2 microns. However, using the procedure of the present invention, films of a corresponding thickness are easily obtained which vary less than 0.2 micron in thickness over the entire surface. Such thickness control is a vital requirement for high-frequency device construction which often requires uniform films of a few microns or less in thickness. This invention further provides a means for obtaining epitaxial films having resistivities in excess of 500 ohm-cm. and is capable of achieving resistivities in excess of 3000 ohm-cm.

While the procedure of this invention is applicable to various semiconductor systems it has been found particularly well adapted to the growth of silicon and germanium epitaxial films.

By way of general description the process of this invention involves the direct vapor phase transfer from a transfer body of the source material to a single crystal semiconductor substrate. This mass transfer is effected with the use of a specified temperature gradient between the transfer body and the substrate and a critical atmospheric composition and reduced pressure.

The operating temperatures of the substrate and source are essentially dictated by the properties of the specific semiconductor involved. For instance, for the growth of silicon films on silicon substrates the source temperature is preferably maintained at 1200° C. to 1350° C. while the substrate should be controlled within the range 1000° C. to 1800° C. For germanium, substrate and source temperatures in the range 400° C. to 680° C. and 700° C. to 900° C. respectively, have been found suitable. The essential requirement of the operating temperatures is that a thermal gradient of at least 20° C. and preferably at least 50° C. be maintained between the substrate and the transfer body. In actual operation this is most conveniently done by heating the region of the transfer body, the thermal gradient resulting from the required spatial separation.

A vital feature of this invention is the use of a reduced pressure which enhances the growth rate and permits a high degree of control over the composition, thickness and crystal quality of the film. In general, pressures in the range of $10^{-1}$ mm. Hg to $10^{-6}$ mm. Hg are effective. However, a more optimum range has been found to be $10^{-2}$ mm. Hg to $10^{-4}$ mm. Hg.

The composition of the atmosphere is preferably a halide such as the tetrahalide of the semiconductor material desired in the film, or a mixture of halides where binary materials or alloys are desired. However, diluent or inert gases may be included in the atmosphere of the reaction vessel in quite large proportions as long as the pressure is sufficiently low to provide an adequate mean free path in the reaction chamber. It is essential that a significant amount of tetrahalide be present, specifically in amounts of at least 10%.

The specific details of the procedure of this invention will perhaps be more readily understood when considered in conjunction with the drawing in which:

The figure is a schematic representation of a particular apparatus adapted to promote the functions of the novel process of this invention.

A specific apparatus adapted to the process of this invention is shown in the figure. In this apparatus the substrate 10 is mounted on a support pedestal 11 in a quartz reaction tube 12. The quartz tube is attached at 13 to a gas supply and control system. This system includes a hydrogen source 14 connected through valve 15 to a hydrogen supply bulb 16 cooled with liquid nitrogen bath 17. Valve 18 controls the flow of hydrogen into the reaction tube. The gas supply system also includes nitrogen source 19 controlled by valve 20 and a source for the semiconductor halide which consists of a storage vessel 21 disposed in liquid nitrogen bath 22 and controlled through valve 23. The gas supply system is attached through valve 24 to vacuum pump 25.

The cold finger 26 is used for storing the halide in a manner hereinafter described. R.F. heating coil 27 provides the means for heating the substrate and transfer body. Ionization gage 28 and thermocouple gage 29 are included to indicate the pressure of the system. The temperature is recorded on an optical pyrometer (not shown).

The operation of this typical system is as follows:

The sample substrate 10 is mounted on the support pedestal 11 in the quartz reaction tube 12. The substrate is mounted on support members protruding from the pedestal so as to maintain a spacing of at least 10 mils between the substrate and the pedestal. The support pedestal is the transfer body providing the source material. The entire system is evacuated to the desired pressure by means of the vacuum pump 25. The valve 24 is then closed and approximately one cc. of $SiCl_4$ is distilled from the $SiCl_4$ storage bulb 21 into the cold finger 26 and there frozen with liquid nitrogen. Hydrogen is admitted to the system from the hydrogen storage bulb 16 to a pressure of 0.1 mm. Hg and the R.F. coil 27 is turned on. The support pedestal 11 is heated to the operating temperature and maintained there for three minutes. The hydrogen is then pumped out and the $SiCl_4$ in the cold finger is warmed by means of an alcohol-liquid nitrogen bath to a temperature of −100° C. for a period sufficient to provide the desired vapor pressure in the reaction chamber and the deposition begins. At the termination of the run the $SiCl_4$ is frozen out and the R.F. generator is turned off. The reaction tube is back-filled with nitrogen and the sample removed from the system.

The following specific embodiments are given as illustrative of the process of this invention.

*Example I*

A single crystal silicon substrate having a (111) crystallographic surface was prepared by etching and was electromechanically polished to provide a smooth, clean surface. This substrate was a wafer having approximate dimensions of 0.50″ x 0.50″ x 0.010″ and consisted of 0.006 ohm-cm. silicon having n-type impurities. The substrate was mounted on the support pedestal 11 as shown such that its predominant surface area was spaced approximately 400 mils from the support pedestal. The support pedestal served as the transfer body and consisted of 6,000 ohm-cm. p-type silicon. The pedestal transfer body was heated to a temperature of 1325° C. The procedural manipulations and the apparatus were the same as those previously discussed. The substrate temperature was maintained at 1055° C. The $SiCl_4$ pressure in the reaction chamber was 0.015 mm. Hg. The deposition time was 10.5 minutes. An epitaxial silicon film was obtained having a thickness of 5 microns and an n-type impurity concentration of $2.0 \pm 0.5 \cdot 10^{12}$ atoms/cc. The film showed exceptional crystal perfection with a (111) orientation and extremely uniform thickness. Maximum thickness variation was less than 0.3 micron.

*Example II*

Essentially the identical procedure of Example I was followed except that the $SiCl_4$ vapor pressure was adjusted to 0.007 mm. Hg. The film obtained had a thickness of 3.6 microns and essentially the same resistivity and physical characteristics as the film of the previous example. This example illustrates the exceptional reproducibility of film quality and resistivity obtainable with this process.

*Example III*

The procedure of Example I was followed using a boron doped, n-type, pedestal (~0.5 ohm-cm.). The substrate was phosphorus doped, p-type, silicon (~5.0 ohm-cm.) and the film obtained was p-type (~0.4 ohm-cm.) thus exhibiting the adaptation of this invention to the growth of p-n junctions. This particular junction exhibited a reverse breakdown voltage of 50 volts.

*Example IV*

In this example the same procedure was followed with the substitution of $GeCl_4$ for $SiCl_4$ and using a germanium substrate and transfer body. The substrate was p-type germanium doped with $2 \cdot 10^{19}$ gallium atoms/cc. and having a <111> surface orientation. The substrate was electromechanically polished to provide a smooth, clean surface. The temperature of the transfer body was 875° C. The substrate temperature was maintained at approximately 675° C. The pressure of $GeCl_4$ in the reaction chamber was 0.015 mm. Hg. The growth rate was approximately 0.1 micron/25 minutes. With a $GeCl_4$ vapor pressure adjusted to approximately 0.90 mm. Hg the growth rate was approximately 1 micron/70 minutes.

The film was p-type germanium having a resistivity of ~.01 ohm-cm. and a thickness of ~2 microns. It exhibited good single crystal perfection and uniformity.

This invention is adapted to the formation of high quality epitaxial films of any desired resistivity of conductivity type and can provide desired film thicknesses in the range of 0.1 to 30 microns.

Various modifications and additions to the basic procedure of this invention will become apparent to those skilled in the art. All such variations and deviations which basically rely on the fundamental concepts through which this invention has advanced the art are properly considered within the scope of this invention.

What is claimed is:

1. A process for growing an epitaxial semiconductor film on a single crystal semiconductor substrate which comprises mounting said substrate adjacent to a semiconductor transfer body in a closed atmosphere comprising a halide of the semiconductor of said transfer body at a reduced pressure in the range of $10^{-1}$ mm. Hg to $10^{-6}$ mm. Hg, said transfer body comprising the semiconductor material desired in the film, said substrate and said transfer body being spaced at a distance of at least 10 mils and maintaining the temperature of said substrate at least 20° C. lower than the temperature of said transfer body for a period sufficient to obtain an epitaxial film on said substrate.

2. The process according to claim 1 wherein the substrate and the transfer body comprise silicon.

3. The process according to claim 1 wherein the substrate and the transfer body comprise germanium.

4. The process of claim 1 wherein the substrate and the transfer body are of opposite conductivity type.

5. The process of claim 1 wherein the pressure of the said atmosphere is in the range of $10^{-2}$ to $10^{-4}$ mm. Hg.

6. A process for producing an epitaxial silicon film on a single crystal semiconductor substrate which comprises mounting said substrate adjacent to a solid silicon transfer body in a closed atmosphere comprising a silicon halide at a reduced pressure in the range of $10^{-1}$ to $10^{-6}$ mm. Hg, said substrate and said transfer body being spaced at a distance of at least 10 mils and maintaining the temperatures of said substrate and said transfer body in the range of 1000° C. to 1180° C. and 1200° C. to 1350° C. respectively for a time period sufficient to obtain an epitaxial silicon film on said substrate.

7. The process of claim 6 wherein the resistivity of the film is in excess of 500 ohm-cm.

8. The process of claim 6 wherein the atmosphere consists essentially of silicon tetrahalide.

9. The process of claim 6 wherein the thermal gradient between the substrate and transfer body is at least 50° C.

10. A process for producing an epitaxial germanium film on a single crystal semiconductor substrate which comprises mounting said substrate adjacent to a solid germanium transfer body in a closed atmosphere comprising a germanium halide at a reduced pressure in the range of $10^{-1}$ to $10^{-6}$ mm. Hg, said substrate and said transfer body being spaced at a distance of at least 10 mils and maintaining the temperatures of said transfer body and said substrate in the range 700° C. to 900° C., and 400° C. to 680° C. respectively, while maintaining a thermal gradient of at least 20° C. between the substrate and transfer body for a time period sufficient to obtain an epitaxial film on said substrate.

11. The process of claim 10 wherein the atmosphere consists essentially of germanium tetrahalide.

12. The process of claim 10 wherein the thermal gradient between the substrate and transfer body is at least 50° C.

References Cited in the file of this patent

UNITED STATES PATENTS

| | | |
|---|---|---|
| 2,989,376 | Schaefer | June 20, 1961 |
| 3,000,768 | Marinace | Sept. 19, 1961 |